United States Patent
Aoki et al.

(10) Patent No.: US 6,512,255 B2
(45) Date of Patent: Jan. 28, 2003

(54) SEMICONDUCTOR PRESSURE SENSOR DEVICE HAVING SENSOR CHIP COVERED WITH PROTECTIVE MEMBER

(75) Inventors: Takashi Aoki, Toyoake (JP); Yoshifumi Watanabe, Kariya (JP); Takashi Nomura, Tokai (JP)

(73) Assignee: Denso Corporation, Kariya (JP)

( * ) Notice: Subject to any disclaimer, the term of this patent is extended or adjusted under 35 U.S.C. 154(b) by 86 days.

(21) Appl. No.: 09/841,005

(22) Filed: Apr. 25, 2001

(65) Prior Publication Data

US 2001/0028072 A1 Oct. 11, 2001

Related U.S. Application Data

(63) Continuation-in-part of application No. 09/662,923, filed on Sep. 15, 2000, now abandoned.

(30) Foreign Application Priority Data

Sep. 17, 1999 (JP) .............................. 11-264328
Apr. 27, 2000 (JP) ......................... 2000-128260

(51) Int. Cl.⁷ ............................................... H01L 27/20
(52) U.S. Cl. ............................ 257/254; 438/51; 438/53
(58) Field of Search ............................. 257/254; 438/51, 438/53

(56) References Cited

U.S. PATENT DOCUMENTS 4,732,042 A * 3/1988 Adams ......................... 73/754
5,357,673 A * 10/1994 Polak et al. ................. 174/52.2
5,914,507 A * 6/1999 Polla et al. ................... 257/254
6,260,417 B1 * 7/2001 Watanabe et al. .............. 73/754
2002/0062698 A1 * 5/2002 Baba et al. ..................... 73/754

FOREIGN PATENT DOCUMENTS

| JP | 61-288827 | 12/1986 |
| JP | 62-228926 | 10/1987 |
| JP | 63-8523 | 1/1988 |
| JP | 1-140037 | 6/1989 |
| JP | 9-43084 | 2/1997 |

* cited by examiner

*Primary Examiner*—Richard Elms
*Assistant Examiner*—Christian D. Wilson
(74) *Attorney, Agent, or Firm*—Law Offices of David G. Posz

(57) ABSTRACT

A sensor device has a semiconductor sensor chip mounted on a resin package with which insert pins are insert-molded. The sensor chip and the pins are electrically connected to each other by bonding wires. An electrically insulating protective member covers the chip, the pins, and the wires. The protective member has a saturated swelling coefficient of approximately 7 wt % at most when the protective member is immersed into gasoline having a temperature of 20° C. Accordingly, bubbles are prevented from being produced in the protective member.

21 Claims, 11 Drawing Sheets

SEMICONDUCTOR PRESSURE SENSOR DEVICE HAVING SENSOR CHIP COVERED WITH PROTECTIVE MEMBER

CROSS REFERENCE TO RELATED APPLICATION

This is a continuation-in-part of U.S. application Ser. No. 09/662,923 filed Jul. 15, 2000 now abandoned, and is based upon and claims the benefit of Japanese Patent Applications No. 11-264328 filed on Sep. 17, 1999, and No. 2000-128260 filed on Apr. 27, 2000, the contents of which are incorporated herein by reference.

BACKGROUND OF THE INVENTION

1. Field of the Invention

This invention relates to a semiconductor pressure sensor device having a sensor chip mounted on a resin package and covered with a protective member, for detecting a pressure and producing an electrical signal in accordance with the detected pressure, which is suitably used for detecting an engine intake pressure of an vehicle.

2. Description of the Related Art

A conventional semiconductor pressure sensor device for detecting a negative pressure such as an engine intake pressure of a vehicle or the like is constructed as shown in FIGS. 10A and 10B. The sensor device has a semiconductor sensor chip 102 as a pressure-detecting element. The sensor chip 102 has a diaphragm 102a made of a material (for instance, single crystal silicon) utilizing a piezoresistance effect, and several diffusion resistances (not shown) formed on the diaphragm 102a and connected to form a bridge circuit. Changes in value of resistances of the diffusion resistances caused by the deformation of the diaphragm 102a are taken out of the bridge circuit as electrical signals.

The sensor chip 102 is mounted on a recess portion (sensor mount portion) 103 formed in a resin package 101 through a glass base 105 by adhesive or the like. The sensor chip 102 is electrically connected to conductive members 104, which are insert-molded with the resin package 101, by bonding wires 106. Accordingly, this sensor device can output an electrical signal corresponding to the negative pressure applied thereto.

The sensor chip 102 and the bonding wires 106 are covered with protective members J1, J2 made of insulating materials for protection, electrical insulation, and anticorrosion. In view of a method for forming the protective members in the recess portion 103, there are two kinds of structures, a partially filling structure and a fully filling structure.

FIG. 10A shows the partially filling structure. In this structure, after the sensor chip 102, the bonding wires 106, and the entire surface of the recess portion 103 are covered with a thin film resin J1 made of an organic material, the surface of the diaphragm 102a of the sensor chip 102, connection portions between the chip 102 and the wires 106, and connection portions between the wires 106 and the conducive members 104 are covered with a soft protective resin J2. The protective resin J2 is generally a soft gel-like insulating material such as fluorine-containing gel that can be formed by coating and thermal setting. The thin film resin J1 is, for instance, a palylene (polychloroparaxylylene) film that can be formed by a CVD (Chemical Vapor Deposition) method, which has good adhesion to the protective resin J2.

On the other hand, FIG. 10B shows the fully filling structure in which a protective resin J2 fills the recess portion 103 to cover the sensor chip 102 and the bonding wires 106. According to this fully filling structure, the sensor chip 102 and the bonding wires 106 can be easily covered with soft resin such as gel without forming an organic resin thin film that has a high elastic modulus and necessitates an expensive vacuum deposition apparatus. Therefore, in the fully filling structure, since the protective member produces lower stress than that in the partially filling structure, reliability is improved. In addition, since there is no need to use the vacuum deposition apparatus, manufacturing cost is reduced.

The fully filling structure, however, has a problem that bubbles are liable to be produced in the protective resin J2 due to moisture and substances such as gasoline and exhausted condensed gas contained in environment when the sensor device detects the engine intake pressure of the vehicle. That is, such substances are dissolved into the protective resin J2, and evaporated by heat and pressure to produce bubbles in the resin J2.

The occurrence of bubbles is explained in more detail with reference to FIGS. 11A and 11B. In the fully filling structure, the thickness of the protective resin J2 is thicker than that in the partially filling structure, and, for instance, is more than 1 mm. Because of this, gases produced by substances dissolved in the protective resin J2 are difficult to be released from the protective resin J2. As a result, the substances and moisture caught inside the protective resin J2 are vaporized when temperature rises, and, as shown in FIG. 11A, remain in the protective film J2 as bubbles K1. The bubbles K2 grow when the temperature further rises or pressure is negative.

As shown in FIG. 11B, the grown bubbles K1 can produce cracks K2 that extends from the inside to the surface of the protective resin J2. The cracks K2 may generate leakage current from the sensor chip 102 or the bonding wires 106 (in the figure, from the bonding wires 106). The bubbles K1 existing in the vicinity of the connection portion of one the wires 106 with the sensor chip 102 or with the conductive member 104 (with the conductive member 104 in the figure) may cause breakage of the wire 106.

SUMMARY OF THE INVENTION

The present invention has been made in view of the above problems. An object of the present invention is to prevent bubbles from being produced in a protective member covering a sensor chip and an electrically connecting portion of the sensor chip in a semiconductor pressure sensor device.

According to the present invention, a protective member for covering a sensing portion of a sensor chip and a bonding wire has a saturated swelling coefficient of approximately 7 wt % at most when the protective member is immersed into gasoline having a temperature of 20° C. The protective member can prevent bubble from being produced therein. No leakage current and no breakage of the wire occur by bubbles.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS

In preferred embodiments described below, a semiconductor pressure sensor device according to the present invention is applied to detect an engine intake pressure of a vehicle, which is used under environment including moisture and substances such as gasoline, exhausted condensed gas, and light oil.

(First Embodiment)

Figure 1:
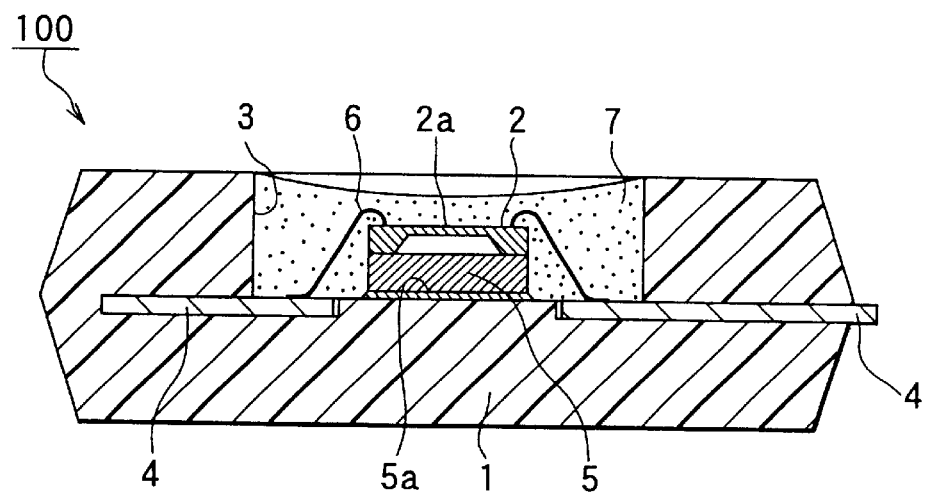
FIG. 1 is a cross-sectional view showing a main part of a semiconductor pressure sensor device in a first preferred embodiment of the present invention.

As shown in FIG. 1, a sensor device 100 in a first preferred embodiment has a fully filling structure. A resin package 1 made of resin such as epoxy resin containing fillers, PPS (polyphenylene sulfide), or PBT (polybutylene telephthalate), and has a recess portion 3 for mounting a sensor chip 2 thereon.

Figure 2:
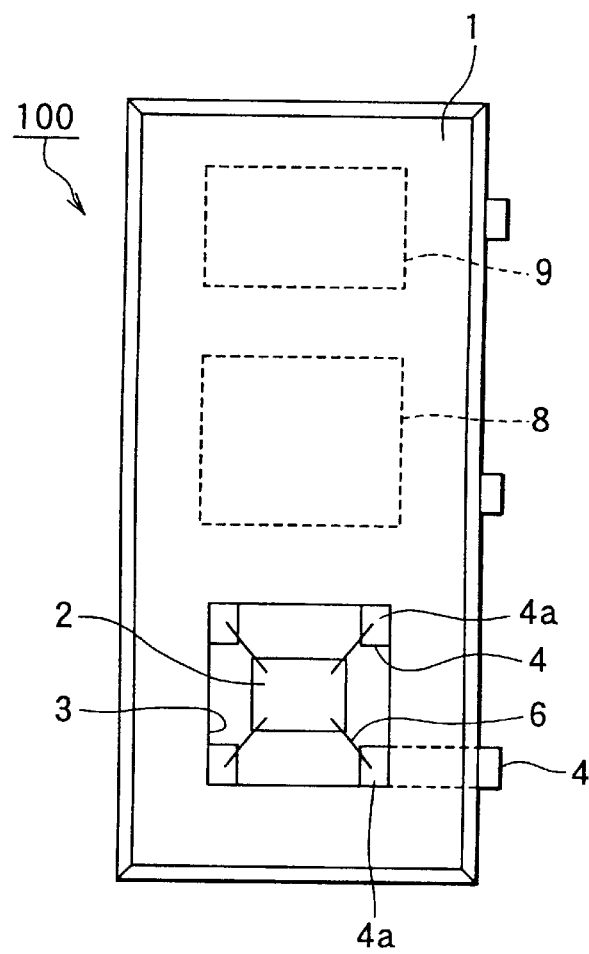
FIG. 2 is a plan view showing the pressure sensor device shown in FIG. 1.

The resin package 1 is integrally formed with several insert pins (conductive members) 4 by insert molding. The insert pins 4 are made of a conductive material such as copper. Predetermined four of the insert pins 4 are exposed at the four corners of the bottom surface of the recess portion 3. The exposed portions of the inert pins 4 shown in FIG. 2 are plated with gold and work as bonding pads 4a.

The sensor chip 2 has a well-known constitution for utilizing a piezoresistance effect, which is composed of a diaphragm 2a as a sensing portion on an upper surface thereof and diffusion resistances (not shown). The sensor chip 2 is die-bonded to the bottom surface of the recess portion 3 through a glass base 5 by, for instance, phlorosilicone system adhesive 5a, and is electrically connected to the bonding pads 4a of the insert pins 4 via bonding wires 6 made of gold, aluminum, or the like.

A protective member 7 made of an insulation material fills the recess portion 3 for protecting the sensor chip 2 and the bonding wires 6, securing an insulating property, and preventing corrosion of those members. The sensing portion (the diaphragm 2a and the diffusion resistances) of the sensor chip 2, the bonding wires 6, the connection portions between the sensor chip 2 and the bonding wires 6, and the connection portions between the insert pins 4 and the bonding wires 6 are covered with the protective member 7.

The protective member 7 is formed in the recess portion 3 in a manner such that fluorine-containing soft resin material (fluorine gel in the present embodiment) is coated in the recess portion 3 and then a thermosetting treatment is carried out (for instance, at 125–150° C., for 1 hour). A saturated swelling coefficient of the protective member 7 when it is immersed into gasoline (lead-free gasoline) having a temperature of 20° C. is controlled to be approximately 7 wt % at most. Because of this, moisture and substances such as gasoline and exhausted condensed gas (aqueous solutions of inorganic components such as $Na_2So_4$ and $NaCl$) contained in the usage environment are difficult to be dissolved into the protective member 7. As a result, bubbles are prevented from being produced in the protective member 7.

The sensor device 100 constructed as above is accommodated in a housing (not shown) and installed in the vehicle such that the recess portion 3 communicates with an engine intake passage. Accordingly, the sensor chip 2 detects a negative pressure. The resin package 1 holds therein an amplifier circuit 8 that amplifies an output signal from the sensor chip 2 and a trimming circuit 9 that adjusts circuit constants such as an amplification factor of the amplifier circuit 8. The sensor chip 2 is connected to the amplifier circuit 8 by a lead frame (not shown) and the like.

Meanwhile, the recess portion 3 communicates with the engine intake passage when the sensor device 100 is installed in the vehicle, so that the protective member 7 is exposed to the environment including moisture and substances such as gasoline and exhausted condensed gas. However, since the protective member 7 of the present embodiment has the saturated swelling coefficient of approximately 7 wt % at most, the above substances are difficult to be dissolved into the protective member 7. As a result, bubbles are prevented from being produced in the protective member 7.

That is, no bubble is produced in the protective member 7 in the vicinity of the portion covered by the protective member 7, i.e., in the vicinity of any one of the sensing portion (the diaphragm 2a and the diffusion resistances) of the sensor chip 2, the bonding wires 6, and the connection portions of the wires 6 with the chip 2 and with the conductive members 4. Therefore, no leakage current is produced from the sensing portion of the sensor chip 2 or the wires 6, the insulating property does not deteriorate, and breakage does not occur to the connection portions of the wires 6. As a result, the sensor device 100 can be provided with high reliability.

Next, the reasons why the saturated swelling coefficient of the protective member 7 with respect to gasoline is controlled to be approximately 7 wt % at most are explained below. The reason why the saturated swelling coefficient with respect to gasoline is used as a reference is because gasoline is most easily dissolved in the protective member 7 in moisture and substances contained in the usage environment in which the sensor device 100 is operated.

The saturated swelling coefficient is measured in the following manner. For instance a Petri dish is filled with lead-free regular gasoline having a temperature of 20° C. A protective member sample (for instance, thermally hardened fluorine gel), a weight of which is previously measured as an initial weight, is immersed into the gasoline. After that, if dissolution of gasoline into the sample is saturated, the sample swelled by gasoline and having an increased weight is pulled out from the gasoline. Then the increased weight of the sample is measured as a saturated weight. A difference between the initial weight and the saturated weight of the sample is divided by the initial weight and is multiplied by 100. The value calculated in this way is determined as a saturated swelling coefficient (wt %).

Figure 10A:
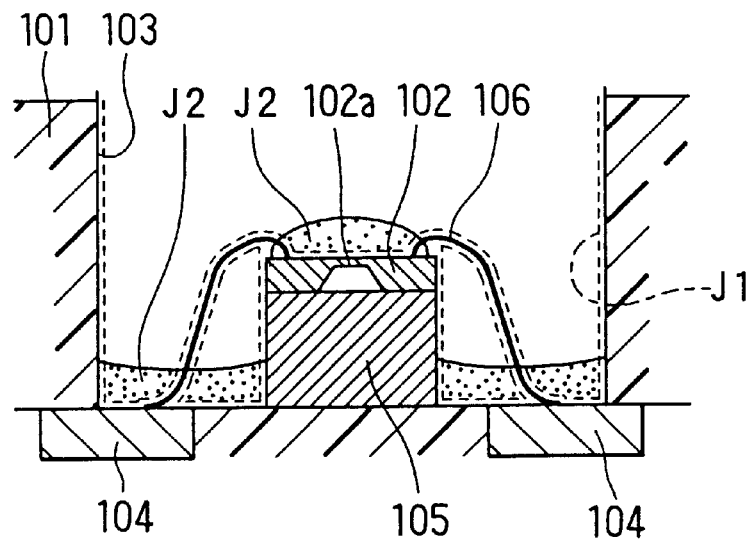
FIGS. 10A and 10B are cross-sectional views showing conventional semiconductor pressure sensor devices.
Figure 10B:
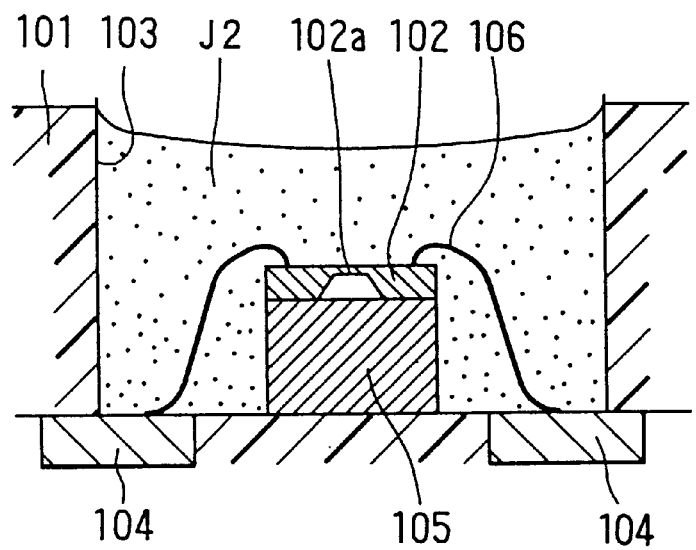
Figure 11A:
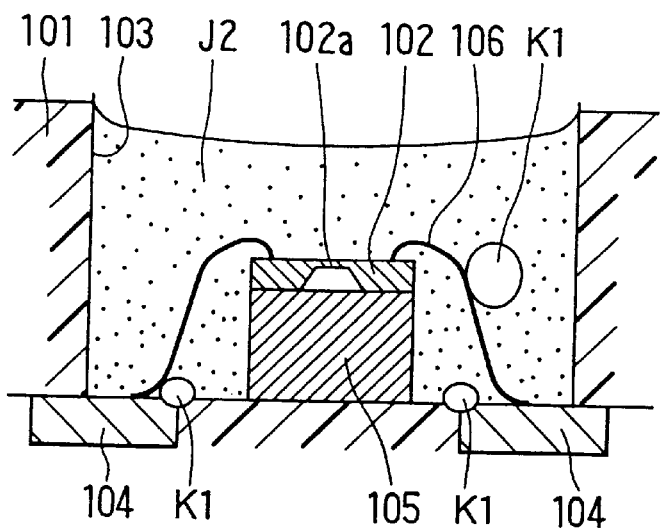
FIGS. 11A and 11B are cross-sectional views for explaining occurrence of bubbles in one of the conventional semiconductor pressure sensor devices.
Figure 11B:
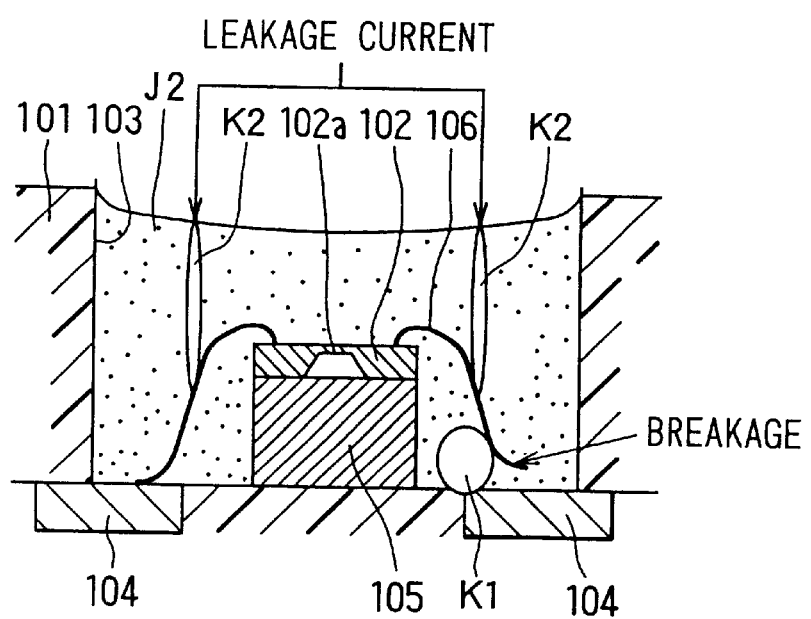

Saturated swelling coefficients of various materials (fluorine-containing gel such as phlorosilicone gel and the like) used as the protective member (protective resin) J2 in the conventional fully filling structure shown in FIG. 10B were measured substantially in the same method as described above. As a result, it was revealed that the conventional protective member J2 generally had a saturated swelling coefficient of approximately 10%. This means that the conventional protective member was increased in weight by 10 wt % by lead-free gasoline dissolved therein.

Figure 3A:
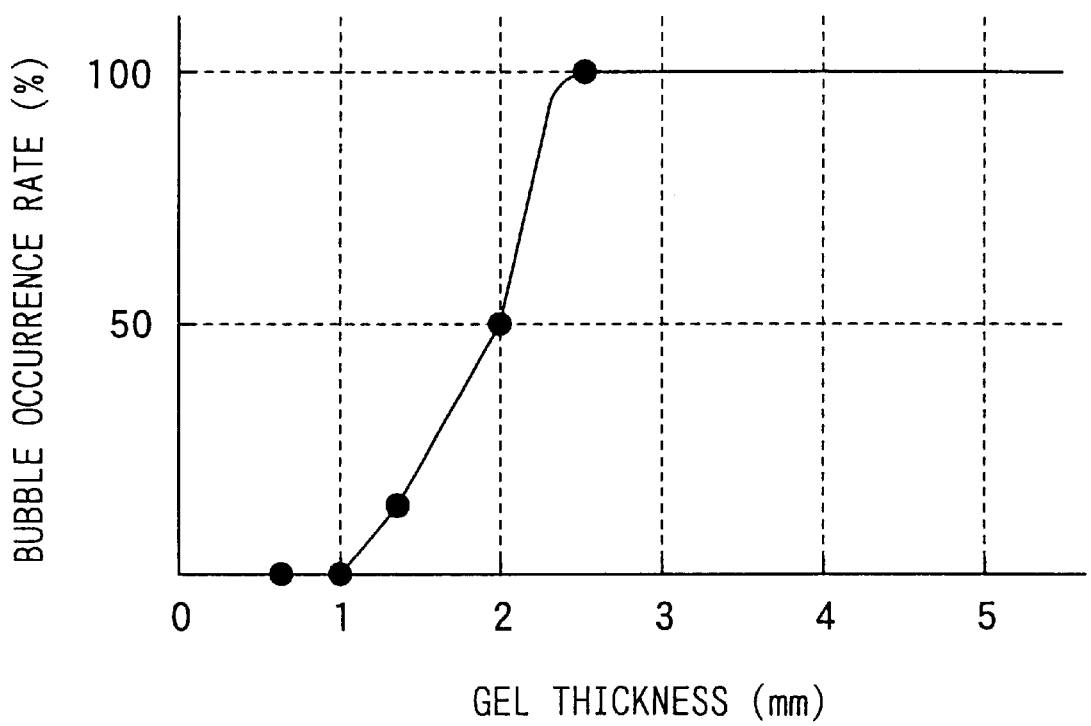
FIG. 3A is a graph showing a relation between a gel thickness and a bubble occurrence rate.

Then, the relation between the thickness of the protective member J2 and the bubble occurrence rate was studied in the fully filling structure sensor device using the conventional protective member J2. The result is shown in FIG. 3A. Fluorine-containing gel having a saturated swelling coefficient of 10 wt % was used as the conventional protective member J2. The thickness (gel thickness) of the protective member J2 was changed by changing the depth of the recess portion 3 as shown in FIG. 3B.

The sensor device having the protective member made of fluorine-containing gel was immersed in lead-free gasoline until gasoline was dissolved and saturated in the gal. After that, the sensor device was heated from 25° C. to 150° C. at a temperature rising rate of 5° C./min in, for instance, a temperature controllable furnace. Bubbles produced in the gel of the protective member were then visually checked, and a rate in area of the bubble occurrence region with respect to an entire area of the gel was determined as a bubble occurrence rate (%).

Figure 3B:
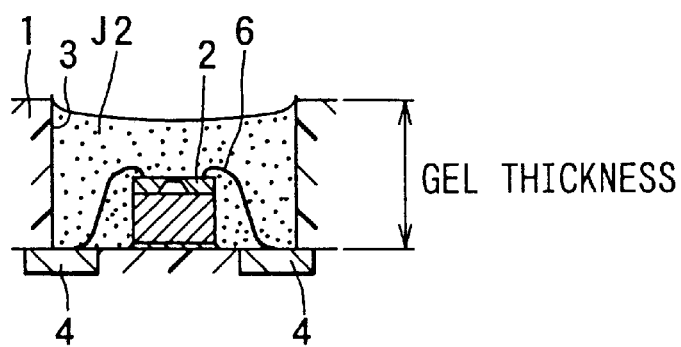
FIG. 3B is a cross-sectional view showing a sensor device from which the relation shown in FIG. 3A was obtained.

According to the result shown in FIG. 3B, it is known that the bubble occurrence rate is increased as the gel thickness is increased. The lead-free gasoline dissolved in the gel diffuses and vaporizes gradually from the gel surface during the temperature rising step described above, and evaporates finally. When the gel thickness is 1 mm or more, the gasoline dissolved in the gel produces bubbles in the gel. This is because the gasoline vaporizes and expands previously to the diffusion thereof.

Considering this result, it is conceivable that a material capable of suppressing solubility of substances therein is used for the protective member to prevent the occurrence of bubbles therein. Specifically, it is conceivable to use, as the protective member, fluorine-containing gel including a large amount of fluorine atoms that have a solubility parameter (SP value) differing from those of moisture and fat system organic substances such as gasoline and light oil to prevent bubbles.

Therefore, with respect to the sensor device 100 including the protective member 7 made of fluorine-containing gel, the relation between the saturated swelling coefficient and the bubble occurrence rate was further examined to determine a preferable range of the saturated swelling coefficient capable of preventing the occurrence of bubbles, adopting the saturated swelling coefficient as an indicator of the solubility. The gel thickness shown in FIG. 4B was set at 5 mm. This is because the gel thickness in the general fully filling structure is 5 mm or less. Further, several sensor devices 100 were prepared to respectively have protective members 7 made of fluorine-containing gel and having various saturated swelling coefficients different from one another.

Figure 4A:
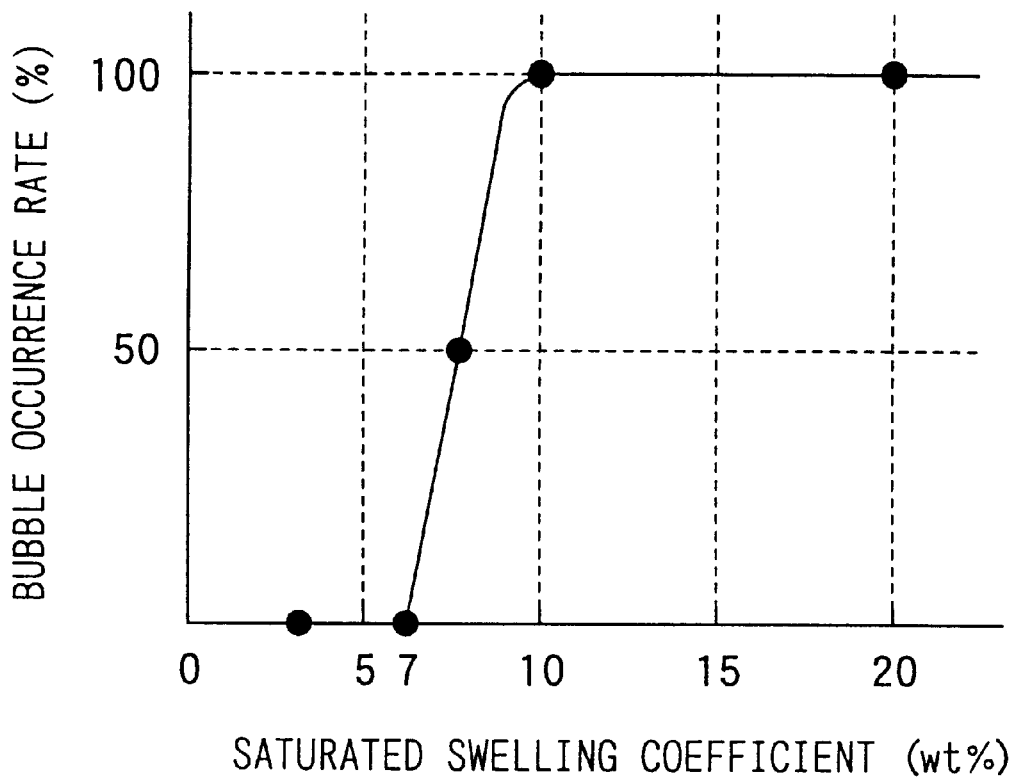
FIG. 4A is a graph showing a relation between a saturated selling coefficient and a bubble occurrence rate.

Each bubble occurrence rate of the sensor devices 100 was measured substantially in the same manner as used for studying the conventional protective member. Then, the relation between the saturated swelling coefficient (wt %) and the bubble occurrence rate (%) was obtained. The result is shown in FIG. 4A.

Figure 4B:
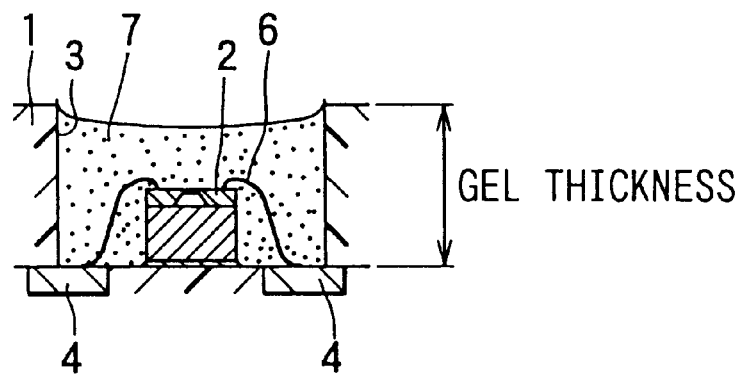
FIG. 4B is a cross-sectional view showing a sensor device from which the relation shown in FIG. 4A was obtained.

As understood from FIG. 4B, it is confirmed that bubbles do not occur in the protective member 7 having the gel thickness of approximately 5 mm or less when the saturated swelling coefficient is approximately 7 wt % or less. Incidentally, even if the gel thickness exceeds 5 mm, the same effect can be provided when the thickness falls in a range adoptable to the general fully filling structure. These are grounds for setting the saturated swelling coefficient of the protective member to be approximately 7 wt % or less in the present embodiment.

Figure 5:
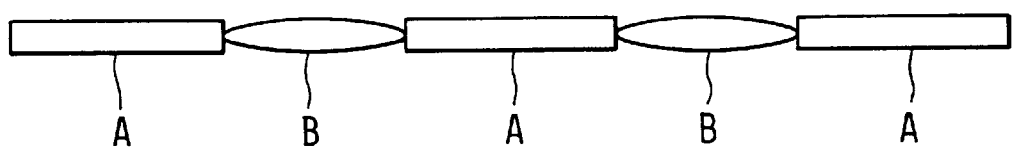
FIG. 5 is a schematic view schematically showing a constitution of a gel material constituting a protective member in the first embodiment.

Next, the gel material constituting the protective member 7 is specifically explained below with reference to FIGS. 5, 6A, 6B, and 6C. As shown in FIG. 5, the gel material is a macromolecule material in which main agent A is bonded by hardening agent B. In the protective member 7 of the present embodiment, a number of fluorine atoms is increased by increasing a number of atoms in the main agent A.

Figure 6A:
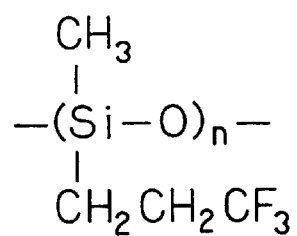
FIGS. 6A and 6B are chemical constitutions of a main agent A shown in FIG. 5.
Figure 6B:
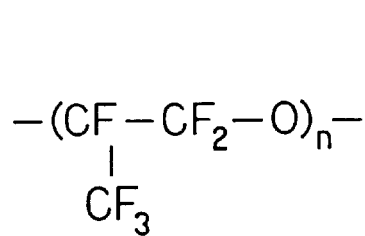
Figure 6C:
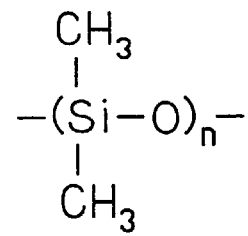
FIG. 6C is a chemical constitution of a hardening agent B shown in FIG. 5.

There are two methods for increasing the number of fluorine atoms in the main agent A. One is to change the main agent A itself. The main agent for the fluorine-containing gel is, for instance, a phlorosilicone skeleton or a fluorine skeleton. These skeletons are respectively shown in FIGS. 6A and 6B. Incidentally, FIG. 6C shows an example of the hardening agent B.

As shown in the figures, the number of fluorine atoms contained in the fluorine skeleton is larger than that contained in the phlorosilicone skeleton. Therefore, the fluorine skeleton is preferable to the phlorosilicone skeleten as the main agent for the protective member 7.

The other one is to increase the molecular weight of the main agent A. The number of fluorine atoms in the protective member 7 can be increased by increasing the molecular weight of the main agent A with respect to the hardening agent B. For instance, the molecular weight of the main agent A is preferably larger than 10,000. However, it should be noted that an excessively increased molecular weight of the main agent A causes phase separation between the main agent A and the hardening agent B.

Incidentally, the main agent A for the protective member 7 in the present embodiment has the fluorine skeleton, and has an increased molecular weight of about 17,000. Specifically, perphloro polyether, which is fluorine-containing gel capable of increasing the number of fluorine atoms effectively, is used as the main agent A.

As another countermeasure other than the application of the material capable of suppressing solubility of the substances by controlling the saturated swelling coefficient of the protective member 7 as described above, it is conceivable to adopt a hard material to prevent the occurrence of bubbles. The protective member 7 should prevent the occurrence of bubbles while securing moderate flexibility.

Therefore, for fluorine-containing gel used as the protective member 7, it is preferable that its hardness specified by penetration of JIS K2220 ¼ cone falls in a range of 10 to 30. When the penetration is less than 10, the protective member 7 is so hard that it can affect the deformation of the diaphragm 2a and the like, i.e., affect the sensitivity of the sensor chip 2. When the penetration is larger than 30, bubbles are liable to be produced.

Therefore, in this embodiment, the protective member 7 preferably has the penetration in a range of 10 to 30. In this case, the vapor pressure of the substances dissolved in the protective member 7 can be suppressed, and the occurrence of bubbles can be prevented more securely in cooperation with the effect of setting the saturated swelling coefficient to be 7 wt % or less.

It is also conceivable to adopt a material capable of improving a transmittance speed of the substances to prevent the occurrence of bubbles. Specifically, it is conceivable that a cross-linking density of the fluorine-containing resin material constituting the protective member 7 is decreased such that the transmittance speed of the substances is increased. However, since the decreased cross-linking density reduces strength of the material, it conflicts with the countermeasure of adopting a hard material by specifying the penetration thereof.

(Second Embodiment)

In the first embodiment described above, the protective member 7 is composed of a single part made of a material (fluorine-containing gel). As opposed to this, in a second preferred embodiment, the protective member 7 is composed of two parts made of materials having Young's modulus different from each other. Incidentally, the same parts and components as those in the first embodiment are denoted with the same reference numerals.

Figure 7A:
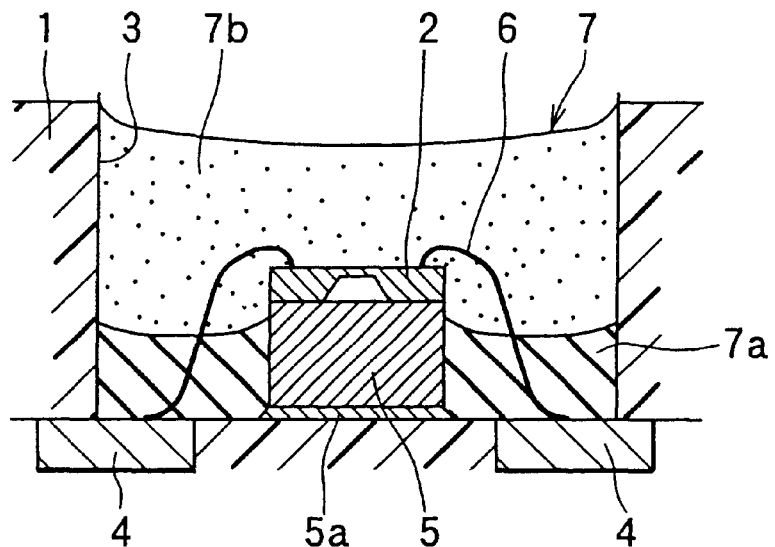
FIGS. 7A and 7B are cross-sectional views showing main parts of pressure sensor devices as first and second examples of a second preferred embodiment.
Figure 7B:
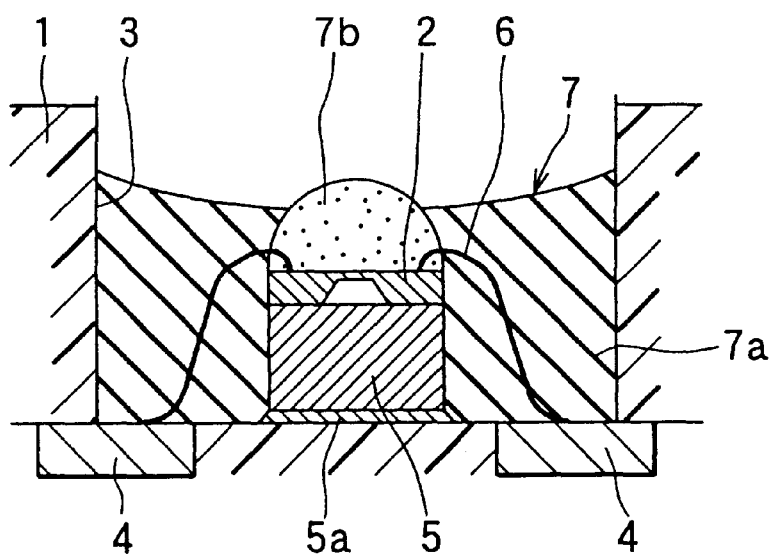

FIGS. 7A and 7B respectively show first and second examples according to the second embodiment. First, in the first example shown in FIG. 7A, the protective member 7 filling the recess portion 3 to cover the sensor chip 2 and the bonding wires 6 is composed of a first protective member 7a provided at a lower side (bottom side of the recess portion 3) and a second protective member 7b provided at an upper side (opening side of the recess portion 3).

The first protective member 7a is made of a fluorine-containing adhesive rubber material having an electrically insulating property and a relatively high Young's modulus (for instance, more than approximately 0.1 MPa, and more preferably more than approximately 0.3 MPa). The first protective member 7a covers the bonding pads 4a of the insert pins 4 and those vicinity, the glass base 5, and the connection portions between the boding wires 6 and the pads 4a while exposing the sensing portion of the sensor chip 2.

The second protective member 7b is made of a material having an electrical insulating property and a relatively low Young's modulus. For instance, the material has a penetration larger than 10. In this case, it is difficult to measure the accurate Young's modulus. That is, the penetration of the second protective member 7b approximates to that of the protective member 7 in the first embodiment. The second protective member 7b covers the first protective member 7a, the sensing portion and the side portion of the sensor chip 2, and the connection portions between the bonding wires 6 and the sensor chip 2. Thus, the bonding wires 6 are covered with the first and second protective members 7a, 7b for protection.

On the other hand, in the second example shown in FIG. 7B, the second protective member 7b covers the sensing portion of the sensor chip 2 and the bonding portions between the bonding wires 6 and the sensor chip 2, and the first protective member 7a covers bonding pads 4a of the insert pins 4 and those vicinity, and the connection portions between the bonding wires 6 and the pads 4a. The bonding wires 6 are covered with the first and second protective members 7a, 7b.

More specifically, in the second example, rather than the two-layer structure as in the first example, the first protective member 7b surrounds the second protective member 7b formed into a semi-circular shape such that a part of the second protective member 7b and the surface of the first protective member 7a are exposed from the recess portion 3. The sensor chip 2 is covered with the first protective member 7a except for the sensing portion. In the both examples of the present embodiment, the protective member 7 is formed in the recess portion 3 by coating and thermal setting as in the first embodiment. The first and second protective members 7a, 7b of the present embodiment including the two examples respectively have a saturated swelling coefficient of being approximately 7 wt % or less when they are immersed into gasoline having a temperature of 20° C. as in the first embodiment. Therefore, in the present embodiment, the protective member 7 has no bubbles produced by moisture and substances contained in the environment, thereby preventing deterioration of the insulating property, breakage of the bonding wires 6, and the like.

In the structure of the resin package 1 into which the insert pins 4 are insert-molded, there is a case where a small amount of air is caught in a gap (generally produced due to resin-shrinkage after the insert-molding is performed) produced between the resin package 1 and each of the insert pins 4. The air caught in the gap can invade into the protective member by heat or pressure to produce bubbles.

Even in such case, in the present embodiment, since the first protective member 7a covering the gap has a relatively high Young's modulus, bubbles can be effectively prevented from being produced by the air caught in the gap. At the same time, since the diaphragm 2a of the sensor chip 2 is covered with the second protective member 7b made of the gel material having a relatively low Young's modulus, excellent insulating protection can be provided without disturbing the sensing performance of the sensor chip 2.

(Third Embodiment)

A third preferred embodiment of the present invention is a modification of the first embodiment, and is constructed by disposing an adhesion film between the protective member 7 and covered portions covered by the protective member to improve adhesiveness between the protective member 7 and the covered portions. Incidentally, the same parts and components as those in the first embodiment are denoted with the same reference numerals.

Figure 8A:
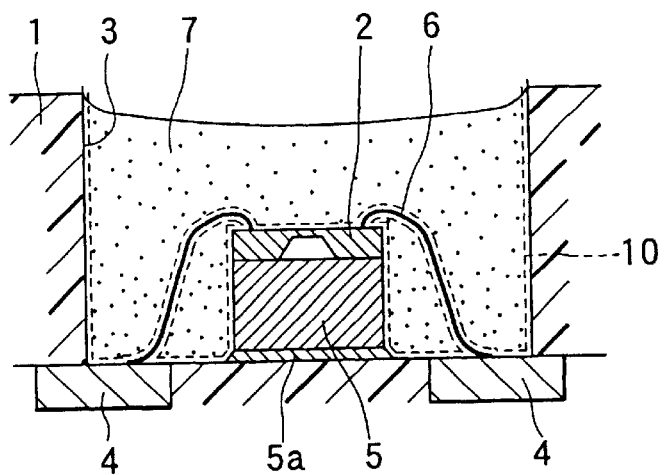
FIGS. 8A and 8B are cross-sectional views showing main parts of pressure sensor devices as first and second examples of a third preferred embodiment.
Figure 8B:
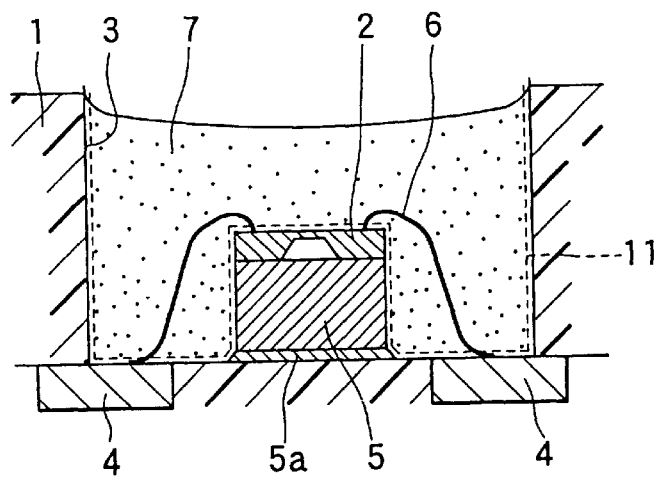

FIGS. 8A and 8B show sensor devices as first and second examples of the third embodiment. In the first example shown in FIG. 8A, an organic film (palylene film in this example) 10, which can be deposited by CVD, is provided as the adhesion film, while in the second example shown in FIG. 8B, a primer 11 is provided as the adhesion film. Each of the adhesion films 10, 11 is formed with a thin thickness to cover the covered portions, and indicated in the figures with broken lines.

In the first example, the organic film 10 is formed by CVD at an entire region of the sensor chip 2, the surfaces of the bonding wires 6 and the recess portion 3 (including the bonding pads 4a of the insert pins 4). After these portions are covered with the organic thin film 10, the recess portion 3 is filled with the protective member 7. on the other hand, in the second example, the primer 11 is formed by coating on the surfaces of the sensor chip 2, the bonding wires 6, and the recess portion 3 (including the bonding pads 4a of the insert pins 4) except the intermediate portions of the binding wires 6. After that, the recess portion 3 is filled with the protective member 7.

According to the present embodiment, the same effects as those in the first embodiment can be provided. In addition to that, the adhesion film 10 or 11 improves the adhesiveness between the protective member 7 and the covered portions. Therefore, the protective member 7 can exhibit the protection performance more effectively.

(Fourth Embodiment)

The embodiments described above respectively adopt a fully filling structure; however, the present invention can be applied to a partially filling structure as well, although the possibility for producing bubbles is basically low in the partially filling structure because the protective member 7 is generally thin therein. A sensor device in the present embodiment is explained referring to FIG. 9 in which the same parts and components as those in the first embodiment are denoted with the same reference numerals as in the first embodiment.

Figure 9:
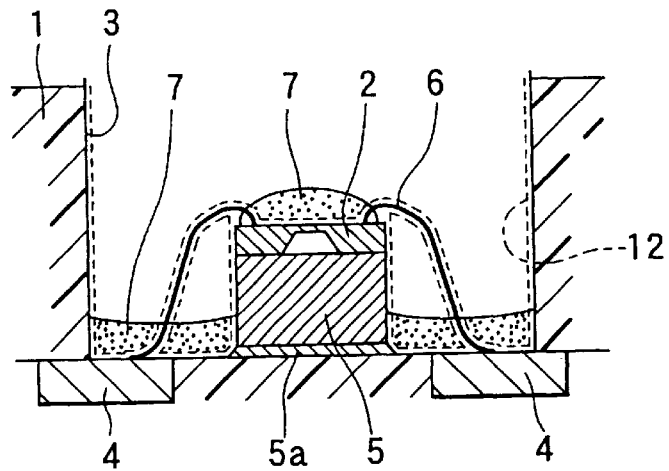
FIG. 9 is a cross-sectional view showing a main part of a pressure sensor device in a fourth preferred embodiment.

The sensor device of the present embodiment adopts the protective member 7 in place of the protective resin J2 in FIG. 10A showing the conventional partially filling structure. Specifically, a palylene film 12 (similar to the thin film resin J1 in FIG. 10A) is formed by CVD on the entire surface regions of the sensor chip 2, the bonding wires 6, and the recess portion 3 (including the bonding pads 4a of the insert pins 4). After that, the protective member 7 is coated to cover the sensing portion of the sensor chip 2, the connection portions between the sensor chip 2 and the bonding wires 6, and the bottom of the recess portion 3, and is hardened. Consequently, the partially filling structure shown in FIG. 9 is provided not to produce bubbles in the protective member 7.

(Fifth Embodiment)

Figure 12:
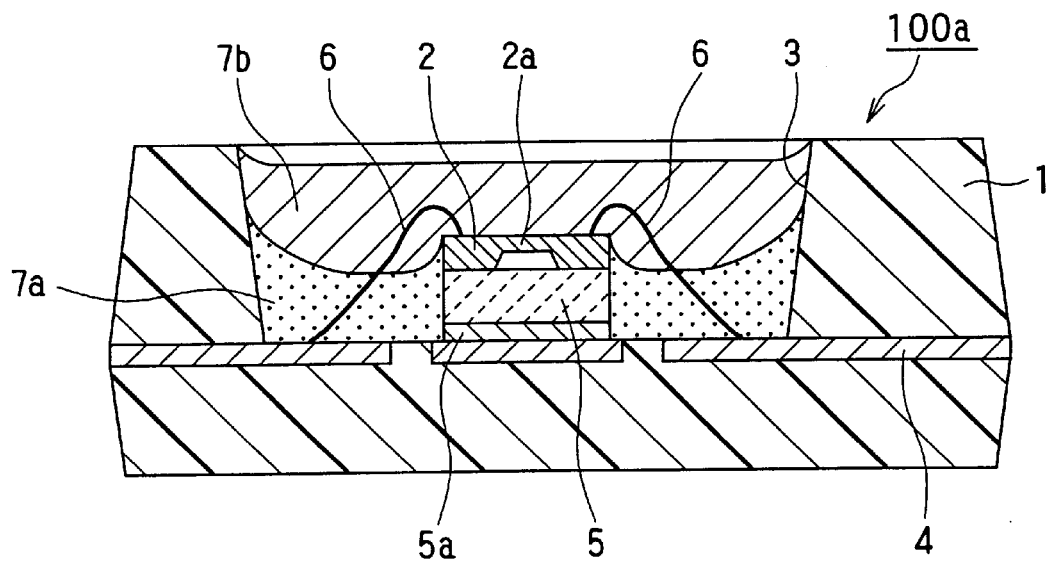
FIG. 12 is a cross-sectional view showing a semiconductor pressure sensor device in a fifth preferred embodiment of the present invention.

The structure shown in FIG. 7A in the second embodiment is further studied and detailed explanations are added as a fifth preferred embodiment of the invention. A sensor device 100a adopting first and second protective members 7a, 7b is shown in FIG. 12. The other features of the sensor device 100a are substantially the same as those of the sensor device 100 shown in FIG. 1.

Similarly to the structure shown in FIG. 7A, a protective member has a two-layered structure composed of the first and second protective members 7a, 7b. Each of the first and second protective members 7a, 7ba is formed from a base material having chemical resistance, and each glass transition temperatures of the protective member 7a or 7b is lowered to be smaller than that of the respective base material by mixing the base material with a material (auxiliary material) having a glass transition temperature lower than that of the base material. Both the protective members 7a, 7b are formed by thermally hardening fluorine-containing base materials composed of base polymer such as $(-CF_2-C_2F_4-O-)_n$ and cross-linking agent.

As described in the second embodiment, the base material of the first protective member 7a is fluorine-containing rubber material having chemical resistance and high elastic modulus for preventing occurrence of bubbles from gaps between the insert pins 4 and the resin package 1 and other portions, and the base material of the second protective member 7b is fluorine-containing gel material having chemical resistance and low elastic modulus not to imparting stress to the sensing portion and the wires 6.

The base materials of the first and second protective members 7a, 7b have following individual properties. First, the base material of the first protective member 7a is fluorine-containing rubber having a glass transition temperature. of about −20° C., a saturated swelling coefficient of about 7 wt % or less, and a Young's modulus of about 0.1 MPa or more. The base material of the second protective member 7b is fluorine-containing gel having a glass transition temperature of about −20° C., a saturated swelling coefficient of about 7 wt % or less, and penetration of JIS K2220 ¼ cone falling in a range of 10 to 30.

Further, fluorine-containing oil having a glass transition temperature of about −110° C. is used as an auxiliary material having a glass transition temperature lower than that of the base materials in this embodiment. This fluorine-containing oil is mixed with each base material of the protective members 7a, 7b. Accordingly, the glass transition temperature of both the protective members 7a, 7b is lowered as a whole as compared to that (about −20° C.) of the base materials, and is controlled to be about −55° C. Here, the mixing ratio of the fluorine-containing oil with respect to the base material is, in each of the first and second protective members 7a, 7b, for example, 40 wt %.

When the first and second protective members 7a, 7b containing these materials are formed in the recess portion 3, after fluorine-containing rubber mixed with fluorine-containing oil, and fluorine-containing gel mixed with fluorine-containing oil are successively disposed in the recess portion 3 under vacuum, a thermosetting treatment is performed at, for example, 150° C.

Figure 13A:
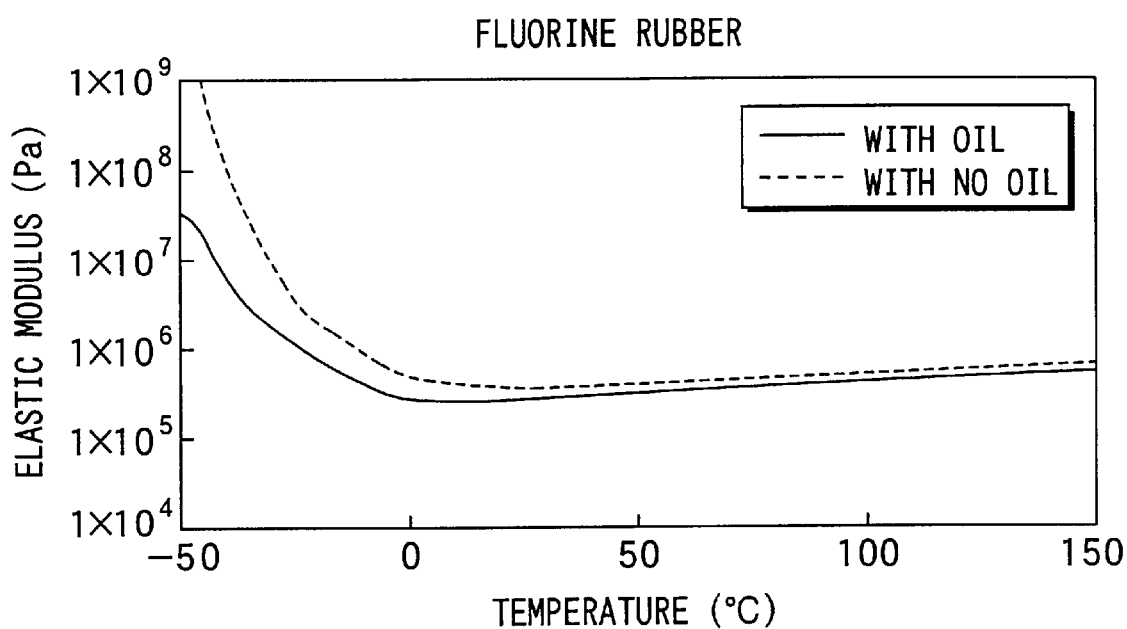
FIGS. 13A and 13B are graphs showing temperature dependencies of elastic modulus of protective members in the fifth embodiment.
Figure 13B:
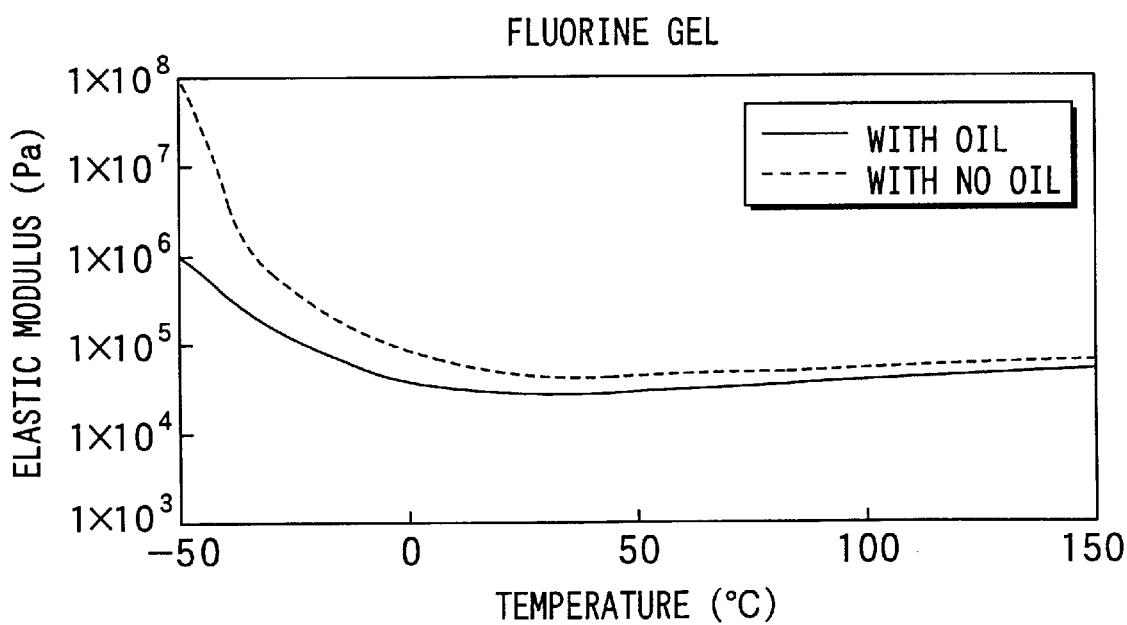

Here, FIGS. 13A and 13B show temperature dependencies of the elastic modulus (Young's modulus after thermosetting) of the first and second protective members 7a, 7b. FIG. 13A shows a case of the first protective member 7a containing fluorine rubber as a base material, and FIG. 13B shows a case of the second protective member 7b containing fluorine gel as a base material. In FIGS. 13A and 13B, the temperature dependency of the protective member containing oil according to the present embodiment is indicated with a solid line, and the temperature dependency of a protective member containing no oil is indicated with a broken line as that of a comparative protective member.

According to the figures, regarding fluorine rubber and fluorine gel containing no oil (whose glass transition temperature: about −20° C.) as the comparative protective members, the elastic modulus (Young's modulus) of the fluorine rubber increases suddenly, for example, from 20 MPa to 100 MPa in a temperature range of −20° C. to −40° C., and the elastic modulus of the fluorine gel increases suddenly, for example, from 0.3 MPa to 5 MPa in the temperature range of −20° C. to −40° C.

On the other hand, regarding the first and second protective members 7a, 7b according to the present embodiment, because both the glass transition temperatures are lowered from that of the respective base materials (−20° C.→−55° C.), the increases in elastic modulus can be suppressed largely at the lower temperature (than zero) while maintaining the elastic modulus properties of the base materials at the room temperature and higher temperature, in comparison with the base materials (without oil) as the comparative protective members.

Further, in sensor devices respectively adopting the first protective member 7a (marked with ●: fluorine rubber containing oil) and the second protective member 7b (marked with ■: fluorine gel containing oil) in this embodiment and a sensor device adopting a two-layered structure of the comparative protective members (marked with ○: fluorine rubber containing no oil and marked with fluorine gel containing no oil), a relation between the elastic modulus of the protective member and stress occurring therein was examined at −40° C.

Figure 14:
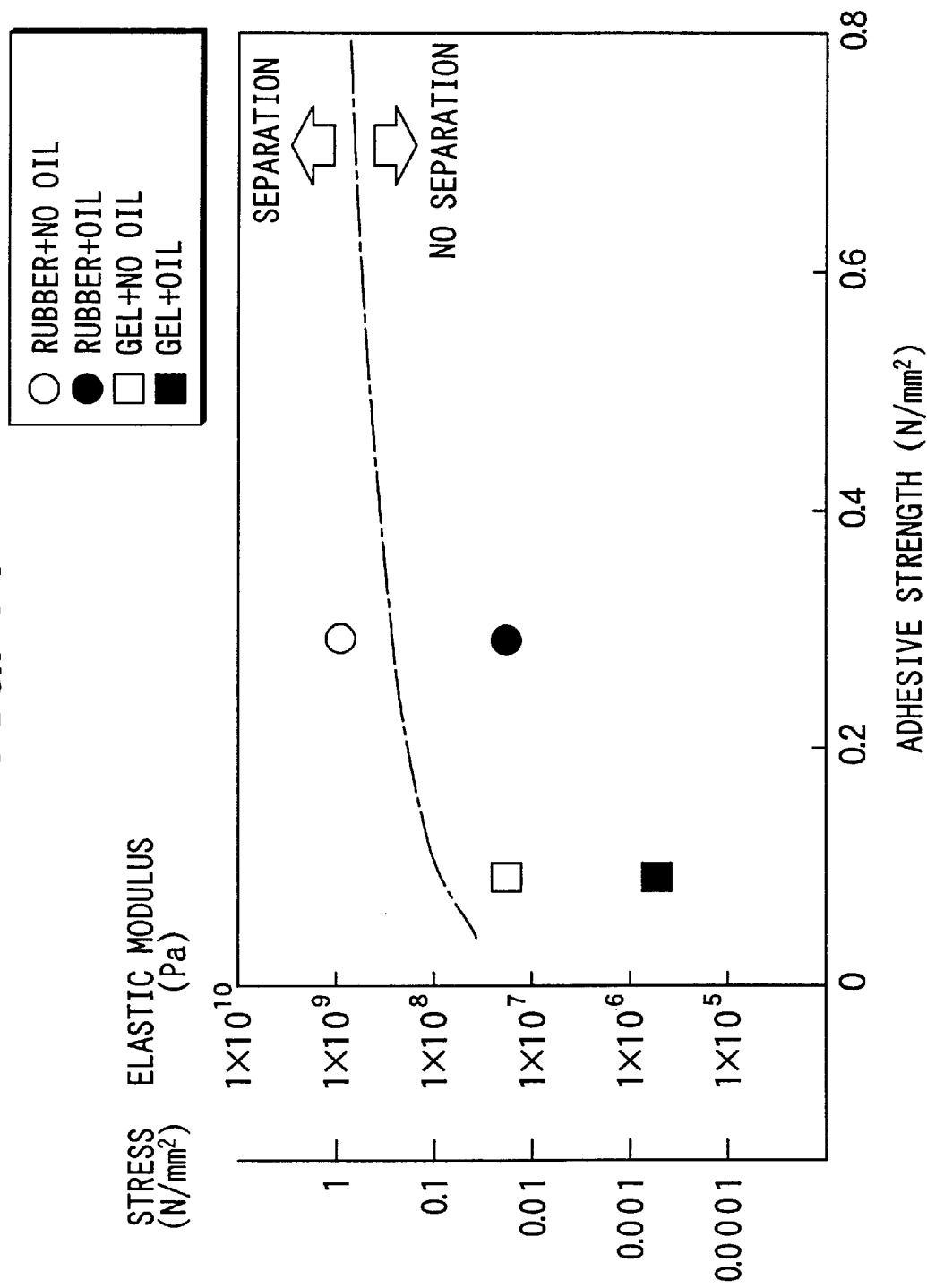
FIG. 14 is a graph showing relations of stresses and elastic modulus of protective members with respect to adhesive strength.

FIG. 14 shows the results, in which a horizontal axis indicates adhesive strength (N/mm$^2$) between the protective member and PPS constituting the resin package 1, and vertical axes indicate elastic modulus (Pa) and generated stress (N/mm$^2$), respectively. In the relation between the adhesive strength with respect to PPS, and stress, it is found that separation occurs in a protective member having an elastic modulus larger than values indicated by one-dot chain line k in FIG. 13.

Specifically, the comparative protective member made of fluorine rubber containing no oil causes separation. However, in both the protective members 7a, 7b (fluorine rubber and fluorine gel with oil) of the present invention, it is revealed that the elastic modulus at −40° C. is reduced and the generated stress is lowered as compared to those of the comparative protective members (with no oil).

Thus, according to the present embodiment, the glass transition temperatures of the protective members 7a, 7b can be shifted to the lower temperature side to suppress stress generated at the lower temperature as small as possible while keeping elastic modulus at a high temperature sufficient for preventing occurrence of bubbles due to expansion of gasoline. Therefore, the protective members of the present embodiment prevent not only the occurrence of bubbles due to expansion of gasoline at a high temperature but also excessive stress applied to the sensing portion at a low temperature and separation from the package 1, simultaneously.

In consequence, the present embodiment can provide a sensor device having improved chemical resistance without causing deterioration in sensor characteristics in a low temperature environment. The sensor device is especially useful as an intake pressure sensor for a vehicle because the protective members 7a, 7b have the glass transition temperature of about −55° C. lower than −30° C. that is a lower limit in a usable range of such an intake pressure sensor.

Further, FIG. 14 shows at least the addition of fluorine-containing oil to the protective member 7a (fluorine-containing rubber) can prevent the separation from the resin package 1. That is, the effect for preventing the separation can be enhanced by oil added to the protective member 7a.

The base materials for the protective members are not limited to fluorine-containing rubber and fluorine-containing gel, but may be other materials so long as the materials have chemical resistance. As materials having glass transition temperatures lower than those of base materials, various materials may be used in place of fluorine-containing oil.

While the present invention has been shown and described with reference to the foregoing preferred embodiments, it will be apparent to those skilled in the art that changes in form and detail may be made therein without departing from the scope of the invention as defined in the appended claims.

For instance, the sensor chip is not limited to the diaphragm type utilizing the piezoresistance effect, but may be other types such as an electrostatic capacitance type semiconductor sensor chip. Although the recess portion 3 is provided on the resin package 1 to hold the sensor chip 2, the recess portion 3 is not always necessary.

The conductive portions may not be provided by being insert-molding the pins into the resin package, and may be provided on a ceramic package that accommodates the sensor chip therein. A monolithic constitution integrating the amplifier circuit 8 and the trimming circuit 9 therein can be provided for the sensor chip 2.

In the second embodiment and the fifth embodiment, the first protective member 7a is sufficient to cover at least the insert pins 4 and those vicinities. A third layer may be disposed between the first protective member 7a and the second protective member 7b to have hardness that is an intermediate level between the first protective member 7a and the second protective member 7b. In this case, it is apparent that the third layer has a saturated swelling coefficient of approximately 7 wt % or less.

Also in the embodiments described above, the present invention is applied to a pressure sensor device for detecting an engine intake pressure of a vehicle. The present invention is not limited to that but may be applied widely to other devices such as a pressure sensor device for detecting a pressure in an intake system or an exhaust gas system of an internal combustion engine using gasoline, light oil, or the like.

When the present invention is applied to a pressure sensor device that does not detect a negative pressure, in the structure shown in the fifth embodiment, there is no need to use high elastic modulus fluorine rubber for preventing occurrence of bubbles as the protective member. In this case, a structure shown in FIG. 15 is applicable.

Figure 15:
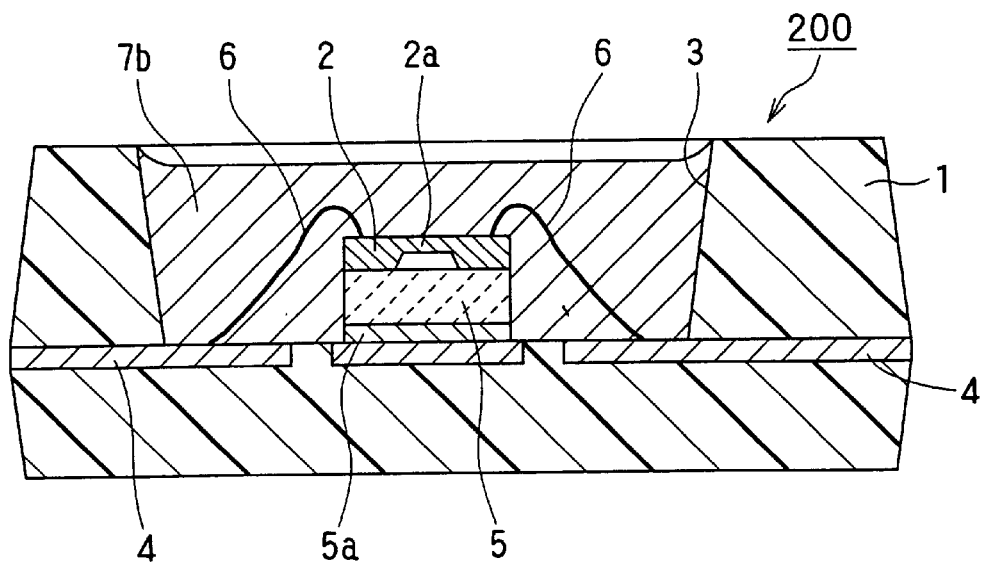
FIG. 15 is a cross-sectional view showing a semiconductor pressure sensor device as a modified embodiment of the present invention.

In a pressure sensor device 200 shown in FIG. 15, the protective member is composed of only the second protective member 7b that is formed by hardening fluorine gel having relatively lower elastic modulus and mixed with fluorine-containing oil. This sensor 200 also provides the same advantages as described above even in case where negative pressure is not detected.

What is claimed is:

1. A semiconductor pressure sensor device, comprising:
   a conductive member;
   a semiconductor sensor chip having a sensing portion for detecting a pressure and generating an electrical signal corresponding to the pressure;
   a bonding wire electrically connecting the sensor chip and the conductive member; and
   a protective member electrically insulating and covering the sensing portion of the sensor chip and the bonding wire, the protective member having a saturated swelling coefficient of approximately 7 wt % at most when the protective member is immersed into gasoline having a temperature of 20° C.

2. The semiconductor pressure sensor device of claim 1, wherein the protective member has a penetration that is specified by a JIS K2220 ¼ cone and falls in a range of 10 to 30.

3. The semiconductor pressure sensor device of claim 1, wherein the protective member is made of a fluorine-containing resin material.

4. The semiconductor pressure sensor device of claim 1, further comprising an adhesion film interposed between the protective member and at least one of the sensing portion of the sensor chip and the bonding wire to improve adhesiveness between the protective member and the one of the sensing portion and the bonding wire.

5. The semiconductor pressure sensor device of claim 4, wherein the adhesion film is one of an organic film and a primer.

6. The semiconductor pressure sensor device of claim 1, further comprising a resin package on which the sensor chip is mounted, wherein:
   the conductive member is composed of an insert pin that is insert-molded with the resin package;
   the protective member has a first protective member covering the conductive member and having a first Young's modulus, and a second protective member covering the sensing portion and having a second Young's modulus smaller than the first Young's modulus;

the bonding wire is covered by the first protective member and the second protective member; and each of the first protective member and the second protective member has the saturated swelling coefficient of approximately 7 wt % at most when the each of the first protective member and the second protective member is immersed into gasoline having a temperature of 20° C.

7. The semiconductor pressure sensor device of claim 6, wherein:

the first protective member is made of a fluorine-containing gel material; and the second protective member is made of a fluorine-containing rubber material.

8. The semiconductor pressure sensor device of claim 1, wherein the sensor chip detects an engine intake pressure of a vehicle.

9. The semiconductor pressure sensor device of claim 1, wherein the protective member contains a base material having chemical resistance and an auxiliary material having a glass transition temperature lower than that of the base material, whereby the protective member has a glass transition temperature lower than that of the base material.

10. The semiconductor pressure sensor device of claim 9, wherein the base material is one of a fluorine-containing gel material and a fluorine-containing rubber material.

11. The semiconductor pressure sensor device of claim 9, wherein the auxiliary material is fluorine-containing oil.

12. The semiconductor pressure sensor device of claim 9, wherein the glass transition temperature of the protective member is equal to or lower than −30° C.

13. A pressure sensor device comprising:

a package having a conductive portion;

a sensor chip fixed to the package and electrically connected to the conductive portion, the sensor chip having a sensing portion for detecting a pressure; and a protective member electrically insulating and covering at least one of the conductive portion and the sensing portion of the sensor chip, the protective member exhibiting a saturated swelling coefficient of approximately 7 wt % at most when the protective member is immersed into gasoline having a temperature of 20° C.

14. The pressure sensor device of claim 13, wherein the protective member is made of a fluorine-containing resin material.

15. The pressure sensor device of claim 13, wherein:

the protective member includes a first protective member covering the conductive portion and a second protective member covering the sensing portion; and each of the first protective member and the second protective member has the saturated swelling coefficient of approximately 7 wt % at most.

16. The pressure sensor device of claim 15, wherein the first protective member has a Young's modulus larger than that of the second protective member.

17. The pressure sensor device of claim 13, wherein the protective member having the saturated swelling coefficient of 7 wt % at most is exposed to an environmental atmosphere surrounding the pressure sensor device.

18. A pressure sensor comprising:

a sensing portion for detecting a pressure and outputting an electrical signal in accordance with a detected value of the pressure; and a protective member covering the sensing portion, the protective member containing a base material having chemical resistance and an auxiliary material, the auxiliary material having a glass transition temperature lower than that of the base material so that the protective member has a glass transition temperature lower than that of the base material.

19. The semiconductor pressure sensor device of claim 18, wherein the base material is one of a fluorine-containing gel material and a fluorine-containing rubber material.

20. The semiconductor pressure sensor device of claim 18, wherein the auxiliary material is fluorine-containing oil.

21. The semiconductor pressure sensor device of claim 18, wherein the glass transition temperature of the protective member is equal to or lower than −30° C.

* * * * *